United States Patent [19]

Iechi

[11] Patent Number: 5,362,673
[45] Date of Patent: Nov. 8, 1994

[54] METHOD OF MANUFACTURING A SEMICONDUCTOR LIGHT EMITTING DEVICE

[75] Inventor: Hiroyuki Iechi, Sendai, Japan

[73] Assignees: Ricoh Company, Ltd., Tokyo; Ricoh Research Institute of General Electronics Co., Ltd., Natori, both of Japan

[21] Appl. No.: 164,066

[22] Filed: Dec. 7, 1993

Related U.S. Application Data

[62] Division of Ser. No. 917,851, Jul. 21, 1992, Pat. No. 5,294,815.

[30] Foreign Application Priority Data

Jul. 29, 1991 [JP]   Japan ................... 3-188995

[51] Int. Cl.$^5$ ............................................ H01L 21/20
[52] U.S. Cl. ............................... 437/127; 437/905; 148/DIG. 99
[58] Field of Search ............... 437/127, 129, 133, 905; 148/DIG. 99

[56] References Cited

U.S. PATENT DOCUMENTS

| | | | |
|---|---|---|---|
| 4,211,586 | 7/1980 | Fang | 257/90 |
| 4,847,846 | 7/1989 | Sone | 257/80 |
| 4,925,811 | 5/1990 | Menigaux et al. | 437/905 |
| 5,117,477 | 5/1992 | Satoh | 385/88 |

FOREIGN PATENT DOCUMENTS

| | | | |
|---|---|---|---|
| 3447452 | 7/1985 | Germany | 437/127 |
| 32373 | 2/1985 | Japan . | |
| 172477 | 7/1988 | Japan | 257/95 |
| 7581 | 1/1990 | Japan | 437/905 |

*Primary Examiner*—R. Bruce Breneman
*Assistant Examiner*—Linda J. Fleck
*Attorney, Agent, or Firm*—Cooper & Dunham

[57] ABSTRACT

A semiconductor light emitting device able to emit a high intensity, stable light. An edge surface lighting type light emitting diode array is formed on a substrate. A light emitting edge surface of each light emitting element is formed by an etching method. A surface of the substrate in front of the light emitting edge surface is formed in multiple stage so that a light beam is not reflected by the surface of the substrate.

2 Claims, 10 Drawing Sheets

METHOD OF MANUFACTURING A SEMICONDUCTOR LIGHT EMITTING DEVICE

This is a division of application Ser. No. 07/917,851 filed Jul. 21, 1992 now U.S. Pat. No. 5,294,815.

BACKGROUND OF THE INVENTION

The present invention relates to a semiconductor light emitting device used as a light source of an image forming apparatus or an optical printer and a manufacturing method thereof. More particularly the present invention relates to a semiconductor light emitting device which comprises a light emitting diode array and a manufacturing method thereof.

Recently, a light emitting diode array used for a light source of an optical printer or an image forming apparatus using an electrographic process has been studied. This light emitting diode array, which comprises self light-emission type array elements, emits light in accordance with an image signal. The light is applied to a photoconductor via an equal multiplication image forming element to form an electrostatic latent image. The latent image is processed by development, transfer, and fixing, and eventually a printing process is completed by an electrographic method.

A light emitting board 101, included in an optical printer using a conventional light emitting diode array, comprises, as shown in FIG. 1, a base board 102 that serves as a heat sink, and circuit members 103, 104,105 adhered to the base board 102. Cables 106,107 are connected to the circuit members 103,104,105 in order to supply an electric power source and to supply an image signal. Reference numerals $108_{-1} \sim 108_{-n}$ indicate aligned light emitting diode array chips, and reference numerals $109_{-1} \sim 109_{-n}$ and $110_{-1} \sim 110_{-n}$ indicate driver circuits that drive the light emitting diode array chips $108_{-1} \sim 108_{-n}$. Each of the chips is a driving IC for light emitting diodes incorporated with a serial/parallel converter for an image signal supplied from the cable 106,107.

In the above mentioned light emitting board 101, image signals for a single line are appropriately supplied to the driver circuits $109_{-1} \sim 109_{-n}$ and $110_{-1} \sim 110_{-n}$. After the data for the entire portion of the single line is supplied to the driver circuits, the data is supplied to the drive terminals of the light emitting diodes. According to the data, each light emitting diode turns on and off and image forming lighting points are generated for one single line.

As shown in FIG. 2, a light emitted from a light emitting diode $201_{-m-p}$, of each light emitting diode $201_{-m}$ is projected onto a photoconducting drum 203 via an equal multiplication image forming system 202 such as a SELFOC lens array or a RMLA (roof mirror lens array).

The size of an optical printer head using such a light emitting diode array can be minimized because there are no moving parts and it has a reduced number of component parts. Additionally, since the light emitting diode is a self lighting type and has a high quenching ratio, a high contrast image is obtained. Further advantages can also be obtained, such as a possibility of making a longer array by connecting a number of chips, and a possibility of making a high speed array by increasing an output of the light emitting diodes.

There are two different type of light emitting diodes used for optical printer heads. One is a plane surface lighting type light emitting diode array which comprises a number of light emitting portions, having a square face for example, arranged in a plane parallel to a base board. The other is an edge surface lighting type light emitting diode array which emits a light from an edge surface perpendicular to a plane surface of a base board.

An example of the basic construction of a plane surface lighting type light emitting diode array, shown in FIG. 3, is suggested in the preliminary draft of the 1980 session of the institute of Electronics and Communication Engineers of Japan. In this plane surface lighting type light emitting diode array, electrodes 121 are formed on both sides of, or around the light emitting portion 120 so that intensity of the light from the light emitting portion 120 becomes uniform in a light emitting plane. However, in this construction, a width of each element becomes a sum of a width of the light emitting portion 120, a width of the electrode 121, and a width of the separation area between the elements.

Thus, forming of a high density light emitting portion, for example more than 600 dpi (dots per inch), is extremely difficult.

An example of the basic construction of an edge surface lighting type light emitting diode array, shown in FIG. 4, is suggested in Japanese Laid-Open Patent Application No. 60-32373. In this example, a plurality of light emitting portions 122 are formed within a layered construction on a base board. These light emitting portions 122 are electrically and physically separated by separation grooves formed to be perpendicular to a surface of the base board. As shown in FIG. 4, the light emitting portions 122 and the electrodes 124,125 are not placed in the same plane, thus a with of each element is a sum of a width of a light emitting portion 122 and a width of the separation area between the elements. Thus, forming of a high density light emitting portion, for example more than 600 dpi (dots per inch), is possible.

Therefore, it is said that an edge surface lighting type light emitting diode array is suitable for a light emitting diode array used as a high density light source for optical printers. With respect to a dispersion of light emitted from each light emitting diode in a light emitting diode array, a good uniformity of a thickness of a crystal layer and uniformity of an electrical and an optical characteristics of a film in a base board have been achieved by the recent progress of technology in crystal growth of compound semiconductors. Accordingly, it has become possible to have a dispersion of light emitted from each light emitting diode of a light emitting diode array on the same chip falls within $\pm 5\%$.

In a light emitting device using the above mentioned light emitting diode array, differences in intensity of light are produced between chips due to the non-uniformity of mounting which results in a non-uniformity of heat radiation, and electrode forming means for producing a characteristic of crystal layer of a compound semiconductor which comprises the light emitting diode array. This results in large differences in contrast or size of dots when used as a light source of an optical printer.

Particularly, in the conventional edge surface lighting type light emitting diode array, as shown in FIG. 4, a light emitting edge surface is formed by cleaving. Producing the light emitting edge surface by cleaving results in various shapes of the light emitting edge surface because the cleaving itself is not a well established technology. Accordingly, differences are produced of scattering and absorbing of the light at the light emitting surface. These differences result in lack of uniformity in the intensity of lights emitted from the light emitting diode array. Since the light emitting edge surface is formed by cleaving, the light emitting edge surface inevitably becomes an edge of the base board. Accordingly, the light emitting surface is easily damaged while handling the light emitting diode array for mounting; thus there are problems in that uniformity of intensity of the light is further reduced and in that the yield of production is low.

As a rudimentary way of eliminating the above mentioned disadvantages, as shown in FIG. 5, it has been considered to form a light emitting edge surface by a method other than cleaving, and to form a terrace 29 under the light emitting edge surface. In this way, the light emitting edge surface can be formed with a uniform shape because the light emitting edge surface is formed by the same separation grooves between elements are formed; the terrace 29, which allows the light emitting edge surface to not become an edge of the base board, is also formed together with the grooves. Therefore, uniformity in the intensity of lights is obtained and yield of production can be increased.

In case a light emitting diode array is used as a light source of an optical printer, as shown in FIG. 2, a light emitted from a light emitting diode $201_{-m-p}$ is focused on a surface of a photoconducting drum 203 via an equal multiplication image forming system 202. In such an optical system, an angle $\Theta$ from a center axis of a light beam having passed through a lens, to an edge of said light beam ($=\arctan(\phi/2s)$: $\phi$ is an effective diameter of the lens, S is a distance of an object) is important. That is, a number of openings of an equal multiplication image forming element (N.A.=n·sin $\Theta$: n is an index of reflection of the medium) is determined by considering MTF (a spatial frequency of the lens). In case a diverging angle $\theta$ from the center axis of a light beam emanating from a light emitting diode to an edge of the light beam is larger than $\Theta$, an efficiency of utilizing light is decreased due to the beam not being able to enter into the equal multiplication image forming element. Therefore, an effort has been made to decrease the angle $\theta$.

Generally, it is known that the diverging angle $\theta$, from a center axis of the beam emitted from an edge surface lighting type light emitting diode to an edge of the light beam is smaller than that of the plane surface lighting type because, in an edge surface lighting type light emitting diode, light emission from near an edge surface mainly contributes to the intensity of light in contrast to emission from an inner side.

According to the results of experimental work by the present applicant, an angle $2\theta$, from edge to edge of a width of a light beam of an edge surface lighting type light emitting diode was measured as 30°∼100°, while that of a plane surface lighting type was measured as approximately 120°. It is assured that making an element having an angle of light beam within this angle range is possible.

When simultaneously forming a light emitting edge surface and separation grooves between adjacent elements on a light emitting diode, a shape of a base board in front of a light emitting edge surface is to be designed so as to satisfy the following equation (1):

$$Lx < Lz/\tan \theta \quad (1)$$

where the parameters of the above equation (1), shown in FIG. 5, are:

Lz: a depth from a light emitting layer 23 to a terrace surface 29a

Lx: a length between a light emitting edge surface and a terrace edge 1a $\theta$: a diverging angle of light beam emitted from a light emitting edge surface.

As far as the elevation angle $\theta$ is concerned, no problem may arise if the equation (1) is not satisfied. Concerning the depression angle $\theta$, as shown in FIG. 7A, if a length Lx between a light emitting edge surface and an edge of the base board (an edge of a terrace 1) is too long, a light beam emitted from the light emitting edge surface is reflected by the top surface of the terrace 29 and the reflected light beam proceeds in a direction of the elevation angle $\theta$. As a result, the angle $2\theta$ increases because of interference of the light beam emitted in the direction of the elevation angle $\theta$ with the light beam reflected by the terrace surface 29a; thus the angle $2\theta$ becomes larger than the angle $2\Theta$ of an equal multiplication image forming element, thus reducing an efficiency of utilization of light.

When Lz is too short, as shown in FIG. 7B, or when the angle $\theta$ is too large, as shown in FIG. 7C, the same phenomena occurs and efficiency of utilization of light is decreased. Accordingly, it is very important to design the base board in front of the light emitting edge surface of an edge surface lighting type light emitting diode array so as to satisfy the equation (1) so that the angle $\theta$ is effectively controlled with respect to the angle $\Theta$ of the equal multiplication image forming element.

When the base board in front of the light emitting edge surface of an edge surface lighting type light emitting diode array is made based on a design satisfying the equation (1), there still remain the following problems in production. In a conventional production process of a compound semiconductor element, usually a 2 inch single crystal wafer is used, and light emitting devices such as the above mentioned edge surface lighting type light emitting diode array are produced by efficiently arranging a plurality of arrays on the wafer, as shown in FIG. 6. Each of the light emitting diode arrays are then cut away along an inscribed line 30 by cleaving technology or dicing technology.

Therefore, accuracy in cutting the wafer is an important factor for satisfying the equation (1). However, as cleaving is not yet an established technology, it is difficult to obtain good accuracy for forming the Lx. Although dicing technology is a more stable technology than cleaving technology, the wafer tends to chip due to the high rotation speed of a disc blade, as high as 30,000 rpm, used to cut the wafer; thus it is difficult to obtain good accuracy without defects in the cut away chip.

Table 1 shows the results of calculations in accordance with the equation $Lx = Lz/\tan \theta; \theta = 15°$ and 50°.

TABLE 1

| $\theta$ | 15° | | | | 50° | | | |
|---|---|---|---|---|---|---|---|---|
| Lz | 1.0 | 2.7 | 5.0 | 10.0 | 1.0 | 5.0 | 10.0 | 12.0 |
| Lx | 3.7 | 10.0 | 18.6 | 37.3 | 0.8 | 4.1 | 8.3 | 10.0 |
| | | | | (μm) | | | | |

By means of the table 1, it is understood, for example, the case the angle $\theta$ is 15° and the depth Lz is 1 μm; the reflection at a terrace can be prevented by having an Lx of 3.7 μm. Similarly, when the angle $\theta$ is 50°, Lx is to be 0.8 μm with an Lz of 1 μm. Accordingly, high accuracy is required when cutting the wafer with respect to the size of Lx.

According to an experiment by the present applicant, Lx can be formed as short as approximately 10 μm, by using dicing technology. When Lx is 10 μm and the angle $\theta$ is 50°, Lz needs to be more than 12 μm. However, etching of 12 μm requires a long process time (approx. 10 min./μm) that results in an increase in the manufacturing costs. Additionally, there is a problem in that if a step between a light emitting element and a metal lead pattern portion is more than 12 μm, the metal lead tends to be easily cut. Therefore, it is preferable to limit techniques to the forming of Lz, but rather to investigate other methods of solving this problem.

On the other hand, in case Lx=10 μm and the angle $\theta$ is 15°, the dry etching process does not take a long time because Lz is required to be only 2.7 μm. The angle $\theta$ is controlled in accordance with epitaxial growth technology, such as the MOCVD method, for forming of layers of an element structure. However, to achieve a condition where the angle $\theta$ is less than 15°, all of the edge surface lighting type light emitting diode arrays on a wafer (on the entirety of the 2 inch wafer) are required to be formed so as to satisfy optically transmissible conditions and a thickness of an active layer has to be uniformly less than 500 Å. The technique for realizing the angle $\theta$ of less than 15° has been achieved experimentally, however, it is difficult to introduce the technique into mass production.

SUMMARY OF THE INVENTION

It is a general object of the present invention to provide a novel and improved semiconductor light emitting device, in which the above mentioned disadvantages are eliminated, and a manufacturing method thereof.

A more specific object of the present invention is to provide a-semiconductor light emitting device in which a high density light emitting portion and a uniformity of intensity of light can be obtained, so that a high density and high quality printing can be realized by using such a device, and an effective manufacturing method thereof.

In order to achieve the above mentioned object, a semiconductor light emitting device of the present invention comprises:
  a substrate on which a light emitting diode is to be formed;
  a light emitting diode comprising a layered structure formed on the substrate, having at least a light emitting layer and electrodes positioned on both sides of the light emitting layer, and having a light emitting edge surface perpendicular to a plane of the light emitting layer; and
  a plurality of grooves separating the light emitting diode into a plurality of light emitting diode elements;
  the substrate including a first surface parallel to a center axis of a light beam emitted from the light emitting diode element, a second surface having a step and being parallel to the first surface, a first terrace edge formed between the first and second surfaces, and a second terrace edge formed on the edge of the substrate;
  the first and second surfaces are formed so as to satisfy the following two equations;

$$Lx_1 < Lz_1/\tan\theta$$

$$Lx_2 < Lz_2/\tan\theta$$

where:
  $Lx_1$ is a distance between the light emitting edge surface and the first terrace edge;
  $Lx_2$ is a distance between the light emitting edge surface and the second terrace edge;
  $Lz_1$ is a distance between the light emitting layer and the first surface;
  $Lz_2$ is a distance between the light emitting layer and the second surface;
  $\theta$ is a diverging angle of the light beam emitted from the light emitting diode elements from the center axis to the surface of the substrate.

A manufacturing method of a semiconductor light emitting device of the present invention comprises:
  forming a plurality of light emitting diodes comprising a layered structure formed on a substrate and having at least a light emitting layer and electrodes on both sides of the light emitting layer;
  separating said light emitting diode into a plurality of light emitting diode elements by forming a plurality of separation grooves, and forming a first surface parallel to a center axis of a light beam emitted from the light emitting diode elements and forming by an etching method a light emitting edge surface perpendicular to the surface of the substrate;
  applying a masking onto a predetermined portion of the first surface;
  forming by an etching method a second surface having a step and parallel to the first surface, a first terrace edge is simultaneously formed between the first and second surfaces; and
  separating each of the plurality of light emitting diodes, so that a second terrace edge is formed on the edge of the substrate;
  the first and second surfaces are formed so as to satisfy the following two equations;

$$Lx_1 < Lz_1/\tan\theta$$

$$Lx_2 < Lz_2/\tan\theta$$

where:
  $Lx_1$ is a distance between the light emitting edge surface and the first terrace edge;
  $Lx_2$ is a distance between the light emitting edge surface and the second terrace edge;
  $Lz_1$ is a distance between the light emitting layer and the first surface;
  $Lz_2$ is a distance between the light emitting layer and the second surface;
  $\theta$ is a diverging angle of the light beam emitted from the light emitting diode elements from the center axis to the surface of the substrate.

According to the present invention, by using a method other than cleaving, such as a dry etching method, for forming a light emitting edge surface, a high density light emitting portion can be formed. Since the light emitting edge surface can be formed with uniform shape, uniformity of intensity of light can be obtained. Further, because the light emitting edge surface is formed in a portion that is recessed from the edge of the substrate, the light emitting edge surface can be protected from damage caused by handling while mounting.

Other objects, features and advantages of the present invention will become more apparent from the following detailed description when read in conjunction with the accompanying drawings.

BRIEF DESCRIPTION OF THE DRAWINGS

FIG. 7 is a schematic cross sectional view of an array for explaining a principle of the present invention.

FIG. 10A showing a state after a first etching process is completed, and FIG. 10B showing a state after a second etching is completed and cut away;

DESCRIPTION OF THE PREFERRED EMBODIMENT

Figure 8:
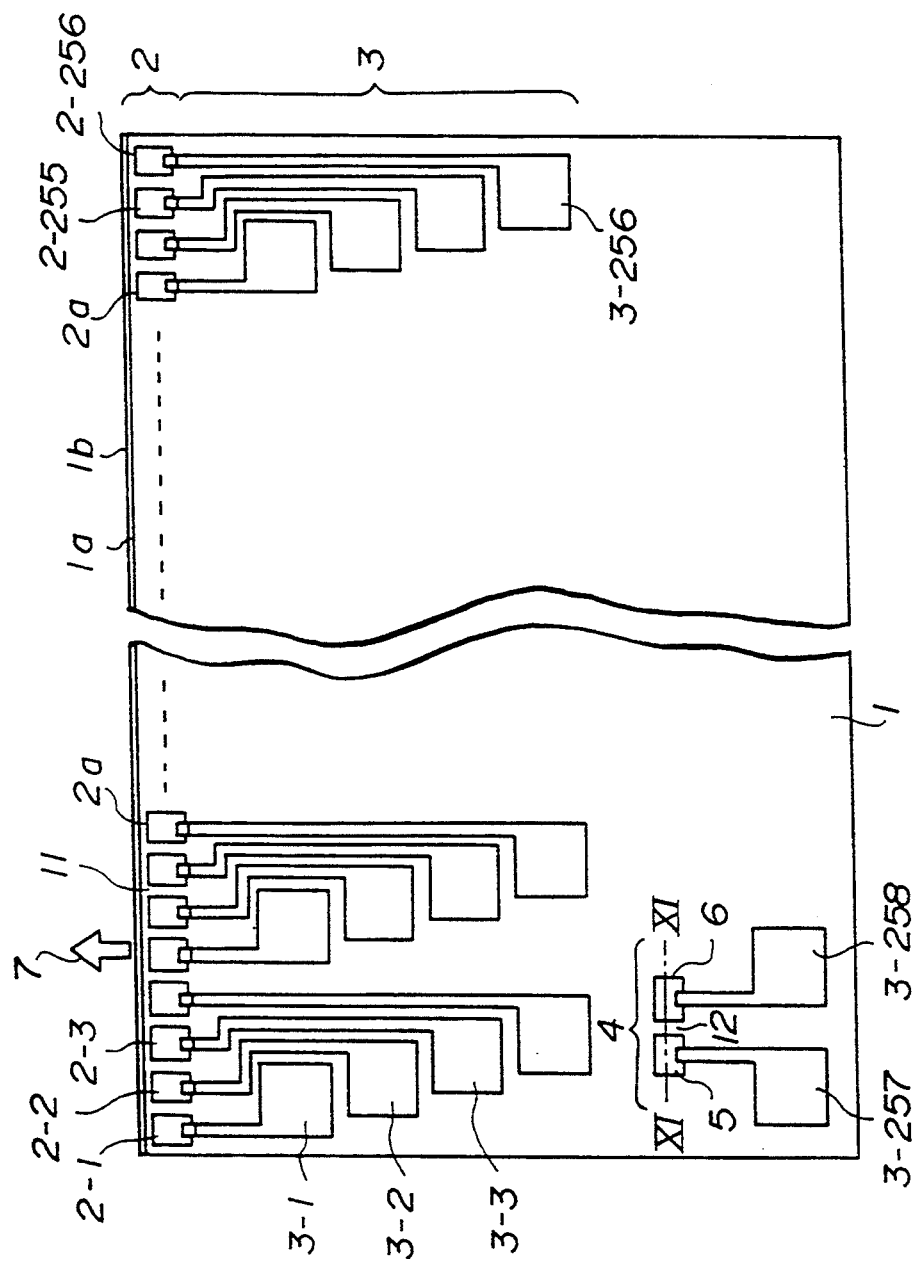
FIG. 8 is a plane view of a semiconductor light emitting device of an embodiment of the present invention.
Figure 9:
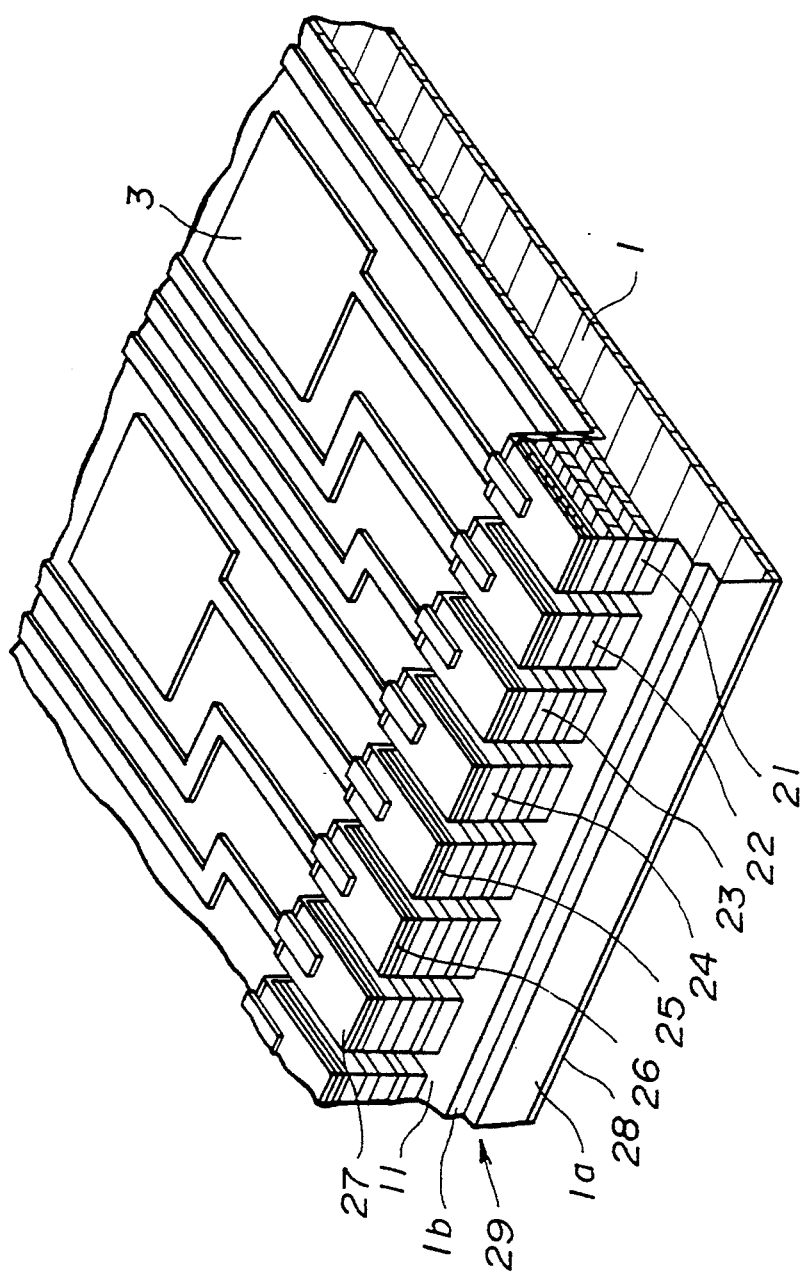
FIG. 9 is a partial elevational view of the semiconductor light emitting device of FIG. 8.
Figure 10A:
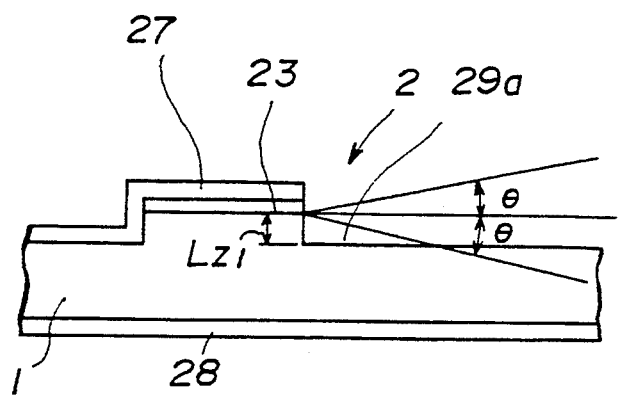
FIGS. 10A and B are partial schematic cross sectional views of an embodiment of the present invention.
Figure 10B:
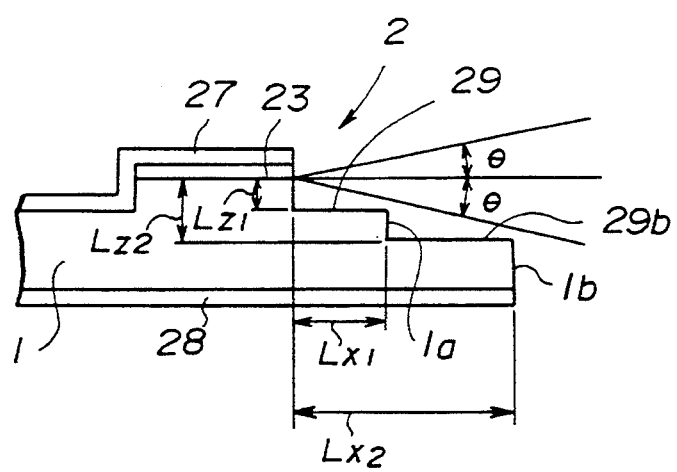

A description will be given of an embodiment of the present invention with reference to FIGS. 8, 9 and 10. FIG. 8 is a plane view of a semiconductor light emitting device of an embodiment of the present invention. FIG. 9 is a partial elevational view of the semiconductor light emitting device of FIG. 8. FIGS. 10A and B are partial schematic cross sectional views of an embodiment of the present invention; FIG. 10A showing a state after a first etching process is completed, and FIG. 10B showing a state after a second etching is completed and cut away.

In a semiconductor light emitting device of FIG. 8, reference numeral 2 (2-1~2-256) indicates an edge surface lighting type light emitting diode array. This array 2 (2-1~2-256) has a dot density of 600 dpi and comprises 256 elements formed on an n-type GaAs substrate 1. A layered structure of the light emitting diode array 2 comprises, as shown in FIG. 9, a plurality of layers formed by the MOVPE method on the substrate (base board) 1. The layers are an n-type buffer layer 21, an n-type $Al_{0.4}Ga_{0.6}As$ clad layer 22, a $Al_{0.2}Ga_{0.8}As$ active layer 23 that is a light emitting layer, a p-type $Al_{0.4}Ga_{0.6}As$ clad layer 24, p-type GaAs cap layer 25, and a p+ type GaAs contact layer 26 doped with zinc in high concentration. Since this layered structure includes a so called double-hetero structure, an elevation angle $\theta$ and a depression angle $\theta$ are equal.

A first separation groove 11, provided between a top surface of the contact layer 26 and a surface of the substrate 1, is formed by a dry etching method using chlorine gas. The light emitting diode elements 2-1~2-256 formed on the substrate 1 are electrically separated by the groove 11. As shown in FIG. 8, the light emitting edge surfaces 2a of light emitting diode elements 2-1~2-256 are formed to be perpendicular to the surface of the substrate 1, and are aligned near to and along a terrace edge 1a of the substrate 1. A terrace 29, best shown in FIG. 9, is formed on the substrate 1 in front of the light emitting edge surface simultaneously when forming the groove 11.

Following the forming of a first terrace surface 29a of the terrace 29 a masking is applied, and then a part of the terrace 29 is removed by a dry etching method so as to form a second terrace surface 29b, which is stepped down from the first terrace surface 29a. The masking in accordance with the present invention is applied so that the following equations are satisfied.

$$Lx_1 < Lz_1 / \tan \theta \qquad (2)$$

$$Lx_2 < Lz_2 / \tan \theta \qquad (3)$$

Where;

$Lx_1$ is a distance between the light emitting edge surface and the first terrace edge 1a;

$Lx_2$ is a distance between the light emitting edge surface and the edge of the substrate 1;

$Lz_1$ is a distance between the light emitting layer 23 and the first terrace surface 29a;

$Lz_2$ is a distance between the light emitting layer 23 and the second terrace surface 29b;

$\theta$ is an diverging angle of the light beam emitted from the light emitting elements 2 from the center axis towards the surface of the substrate 1.

A positive electrode 27 made of Au—Zn/Au is formed on the contact layer 26 of each element 2-1~2-256, and a negative electrode 28 made of Au—Ge/Ni/Au is formed on a back surface of the substrate 1. The positive electrodes 27 are respectively connected to bonding pads 3-1~3-256 that are formed on the other side of the surface of the substrate 1. Accordingly the elements 2-1~2-256 are protected from damage caused by bonding and thus a decrease of efficiency of light emission is prevented. These bonding pads 3-1~3-256 are arranged in four lines to enable a high density mounting.

It is to be noted that since the light emitting diode array described above is produced by the MOVPE method, which enables good uniformity of a film to be maintained, a dispersion of light intensity in the same array falls within ±5%.

A more detailed description of the processing of the terrace 29 will be given below with reference to FIGS. 10A and 10B. The surface 29a of the terrace 29 is simultaneously formed by a first dry etching process during the formation of the first grooves 11, whose bottom surfaces reach to the original surface of the substrate 1. In this process, as shown in FIG. 10A, the dry etching is executed so that a predetermined $Lz_1$, which is determined by the equations (2) and (3), is formed. Then, for a second dry etching process to follow, masking is applied on a portion of the terrace 29 so as to form $Lx_1$ as determined by equation (3). Following the masking process, as shown in FIG. 10B, the second dry etching is applied until a depth of the etching becomes $(Lz_2-Lz_1)$ $Lx_2$ is to be formed at the time each array is cut away from the wafer.

For example, in case the angle $\theta$ is 50° and the value of $Lz_1=2.4$ μm, the values of $Lx_1=2$ μm, $Lz_2=12$ μm, and $Lx_2=10$ μm are determined by the equations (2) and (3). In other words, a depth of the first etching is to be more than 2.4 μm, a depth of the second etching more than 9.6 μm with $Lx_1=2$ μm, and the array is to be cut at 10 μm from the light emitting edge surface. This $Lx_2$, 10 μm, can be achieved by the conventional cutting technology.

As mentioned above, by using a method other than cleaving, such as a dry etching method, for forming a light emitting edge surface, a high density light emitting portion can be formed. Since the light emitting edge surface can be formed with uniform shape, uniformity of light intensity can be obtained. Further, because the light emitting edge surface is formed in a portion that is recessed from the edge of the substrate, the light emitting edge surface can be protected from damage caused by handling while mounting.

The light emitting diode array of the present invention further includes a monitoring device 4, shown in FIG. 8, formed on the surface of the substrate 1 in a position other than the bonding pads 3-1~3-256 and the light emitting diode elements 2-1~2-256. The monitoring device 4 is provided for generating signals for monitoring conditions of the light emitted from the light emitting diode elements 2-1~2-256.

Figure 11:
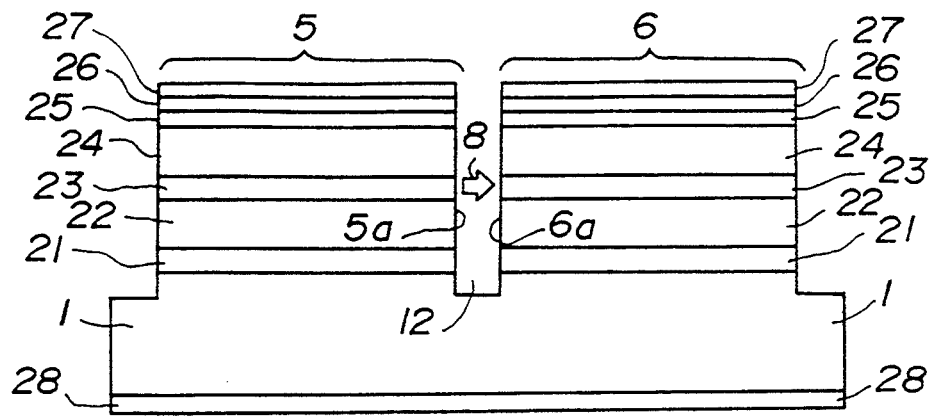
FIG. 11 is a partial cross sectional view of the semiconductor light emitting device of FIG. 8 taken along a line XI—XI.

The monitoring device 4 comprises a layered structure similar to that of the light emitting diode elements 2-1~2-256. As shown in FIG. 11, the monitoring device 4 includes an edge surface lighting type light emitting diode 5 and a photodiode 6. These diodes 5 and 6 are electrically and physically separated by a second separation groove 12, which groove is to be formed perpendicular to the surface of the substrate 1. One side of the groove 12 comprises a light emitting edge surface 5a of the light emitting diode 5 and the other side of the groove 12 comprises an edge surface of the photodiode 6, which surface serves as a light sensing portion. With this construction, a light 8, emitted from the edge surface 5a of the light emitting diode 5, is received by the edge surface of the photodiode 6, which surface is opposite to the surface 5a, without interference.

The monitoring device 4 is able to monitor the conditions of the light emitted from the light emitting diode elements 2-1~2-256 because the structure of the light emitting diode 5 is the same as that of the light emitting diode elements 2-1~2-256. Since the light emitting diode 5 is formed on the surface of the substrate 1 on which the the light emitting diode elements 2-1~2-256 are formed, the light emitting diode 5 is in the same conditions as that of the light emitting diode elements 2-1~2-256. Accordingly, light supplied to the photodiode 6 has the same fluctuations as light emitted from the light emitting diode elements 2-1~2-256. These fluctuations are generated by changes in ambient temperature or changes in supplied voltage. Therefore, the monitoring device 4 can monitor the conditions of light emitted from the light emitting diode elements 2-1~2-256, and thus the light emitting diode array of this embodiment can supply a stable intensity of light.

It is to be noted that the p-type layer of the light emitting diode elements 2-1~2-256, light emitting diode 5 and photodiode 6 can be made of an n-type, and that the reverse is also true, corresponding n-types can be made p-types. Further, although the first and second separation grooves 11 and 12 are formed to be perpendicular to the surface of the substrate 1, this perpendicularity of the grooves is not essential as long as the grooves are not parallel to the surface of the substrate 1, In addition, the bottom surfaces of the grooves 11,12 need not necessarily reach to the surface of the substrate 1, as long as the grooves reach to the lower clad layer by penetrating the active layer 23, which results in an electrical separation of the each light emitting diode elements 2-1~2-256, and diodes 5 and 6.

Figure 12:
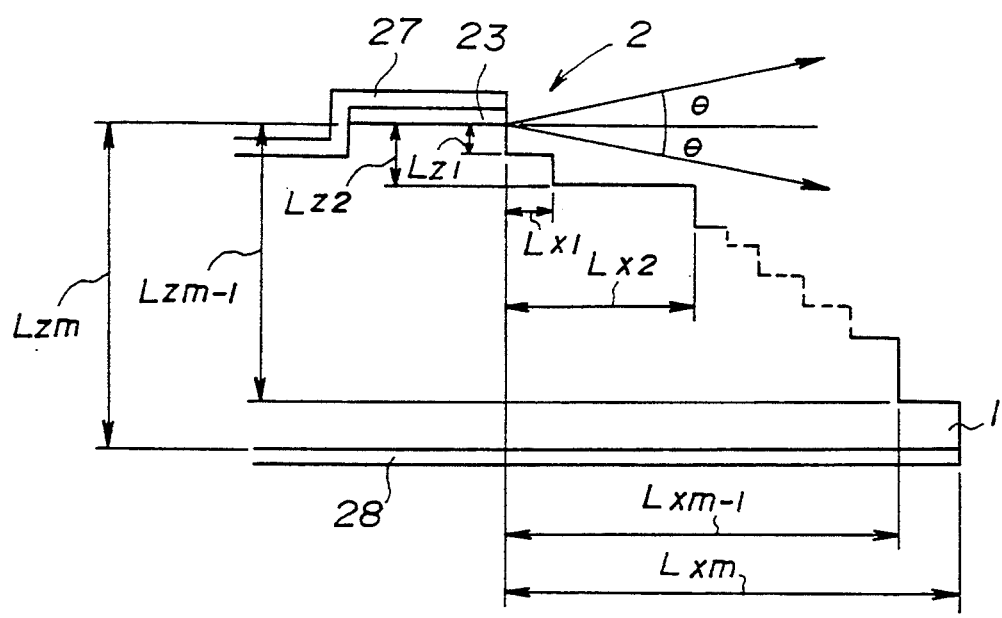
FIG. 12 is a schematic cross sectional view of a variation of the embodiment of the present invention.

FIG. 12 is a variation of the above mentioned embodiment. In FIG. 12, those parts that are the same as corresponding parts in FIG. 10 are designated by the same reference numerals from figure to figure, and descriptions thereof will be omitted. A construction of each light emitting diode elements 2-1~2-256 and a monitoring device 4 is the same as in the above mentioned embodiment, but a portion of the substrate 1 in front of the light emitting diode elements 2-1~2-256 is not formed with two stages but with multiple stages, having m steps, as shown in FIG. 12. The shape of the stages are designed to satisfy the following equation.

$$Lx_n < Lz_n/\tan\theta \qquad (4)$$

Where;

n is an integral number from 1 to m:

$Lx_n$ is a distance between the edge surface of the light emitting diode elements 2-1~2-256 and the terrace edge of the n-th. stage;

$Lz_n$ is a distance between the active layer 23 and the terrace surface of the n-th. stage;

$\theta$ is a diverging angle of the light beam emitted from the light emitting diode elements 2-1~2-256, from the center axis to a direction towards the surface of the substrate 1.

As is apparent from the description of the above mentioned embodiment, the stages are formed so that the light emitted from the edge surfaces of the light emitting diode elements 2-1~2-256 is not reflected by the portion of the substrate 1 in front of the edge surface of the elements 2-1~2-256. The process of forming the multiple stages can be done by repeating the above mentioned process for two stages.

This variation may be applied to an array which has a relatively longer terrace length in front of the elements 2-1~2-256. Thus, a more flexible design of a light emitting diode array can be obtained.

Following will be given, a description of results of an experiment, performed so as to verify the effects of the above mentioned invention.

A sample used in the experiment has a cross section as shown in FIG. 10B. The shape of this substrate sample in front of a light emitting edge surface is formed in two steps as in the embodiment of the present invention mentioned above, which embodiment corresponds to an embodiment variation, having m steps, in a condition where the number of steps is two.

The method of producing the sample is the same as described with respect to the embodiment of the present invention mentioned above. The angle $\theta$ of the sample was 15°, and the sample was produced so as to have the values of; $Lz_1=2.4$ μm, $Lx_1=3.3$ μm, $Lz_2=9.0$ μm, and $Lx_2=10.0$ μm. These values were determined so as to satisfy the equations (2) and (3). In other words, a depth of the first etching $Lz_1$ was 2.4 μm, a depth of the second etching was 9.0 μm, a length of the first terrace surface $Lx_1$ was 3.3 μm, and a distance between the light emitting edge surface and the cut edge of the substrate $Lx_2$ was 10.0 μm.

Substituting $Lx_1=3.3$ μm, $Lz_1=2.4$ μm and angle $\theta=15°$ into the equation (2) we obtain:

$$3.3 < 2.4/\tan 15° = 9.0;$$

substituting $Lx_2=10.0$, $Lz_2=9.0$, and angle $\theta=15°$ into the equation (3) we obtain:

$$10.0 < 9.0/\tan 15° = 33.6.$$

The sample was verified to meet the design of the present invention.

For the purpose of comparison, another light emitting diode was produced, which diode does not meet the design of the present invention, as a comparison sample. This comparison sample was produced by only performing the first etching, and the cross section thereof was like that shown in FIGS. 7A, 7B. The depth of the etching was 2.3 μm and the length of the terrace was 10.6 μm, which values are approximate to that of the sample mentioned above, so as to make a simple comparison with the sample.

The comparison sample corresponds to the variation of the present invention mentioned above in the condition where the number of steps m is one. Accordingly, by substituting n=1 in the equation (4), the equation (4) becomes as follows;

$$Lx_1 < Lz_1/\tan \theta.$$

In the comparison sample, $Lx_1=10.6$ μm and $Lz_1=2.3$ μm; with these values, the above equation is not satisfied. The comparison sample was verified not to meet the design of the present invention.

Figure 13A:
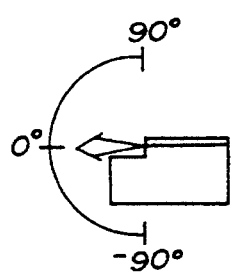
FIG. 13A is a graph showing results of measurement of the comparison sample.
Figure 13A:
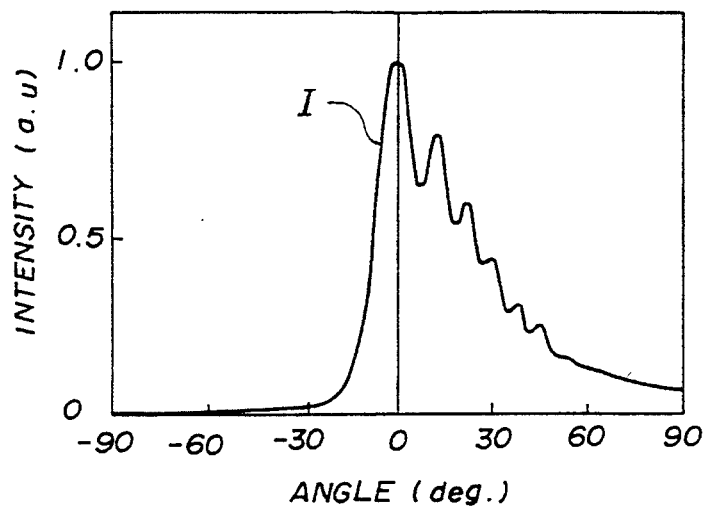
Figure 13B:
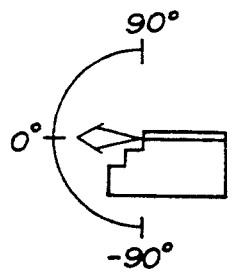
FIG. 13B is a graph showing results of measurement of the sample of the present invention.
Figure 13B:
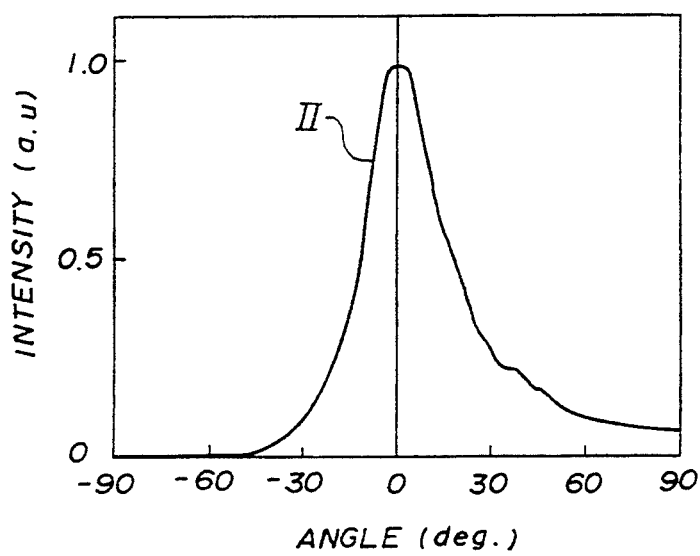

Then, measurements were taken of the far field pattern for both the sample of the present invention and the comparison sample. FIG. 13A is a graph showing results of measurement of the comparison sample. FIG. 13B is a graph showing results of measurement of the sample of the present invention.

Figure 1:
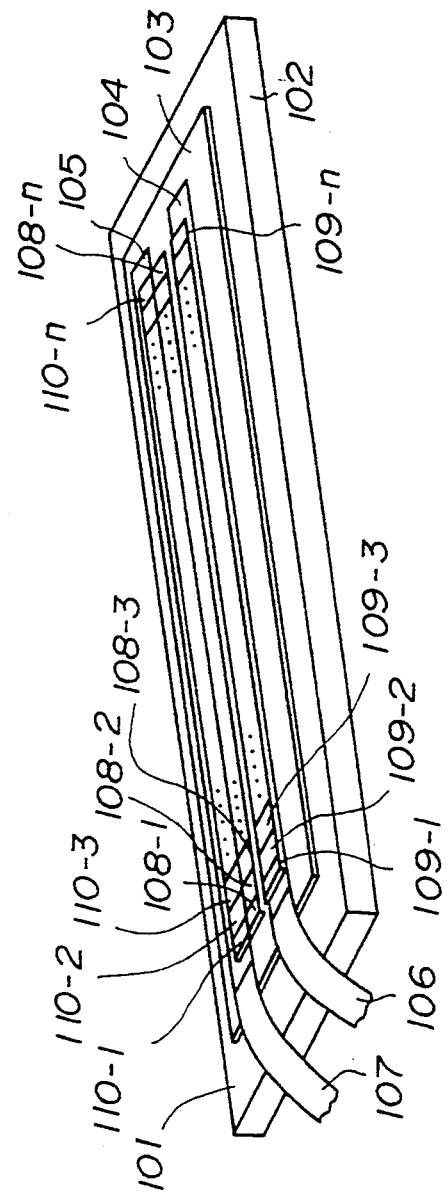
FIG. 1 is an elevational view of a light emitting board which is included in a printing head using a conventional light emitting diode array.
Figure 2:
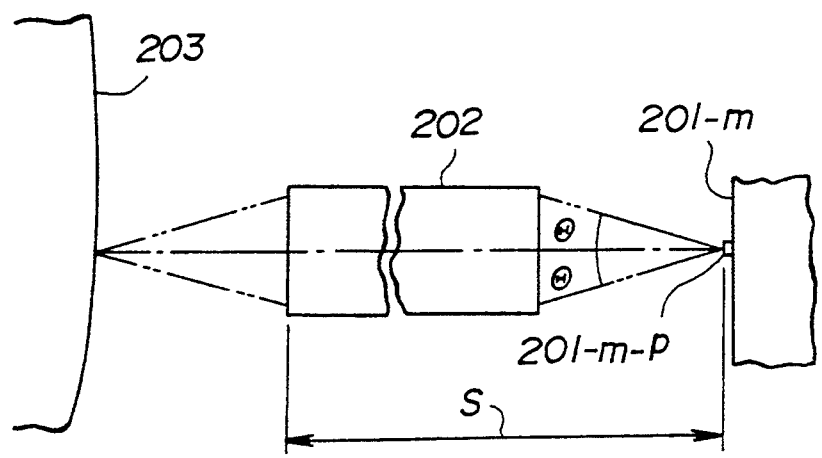
FIG. 2 is a schematic illustration for explaining a relationship between a light emitting portion of a light emitting diode array and an image formed on a surface of a photoconductor.
Figure 3:
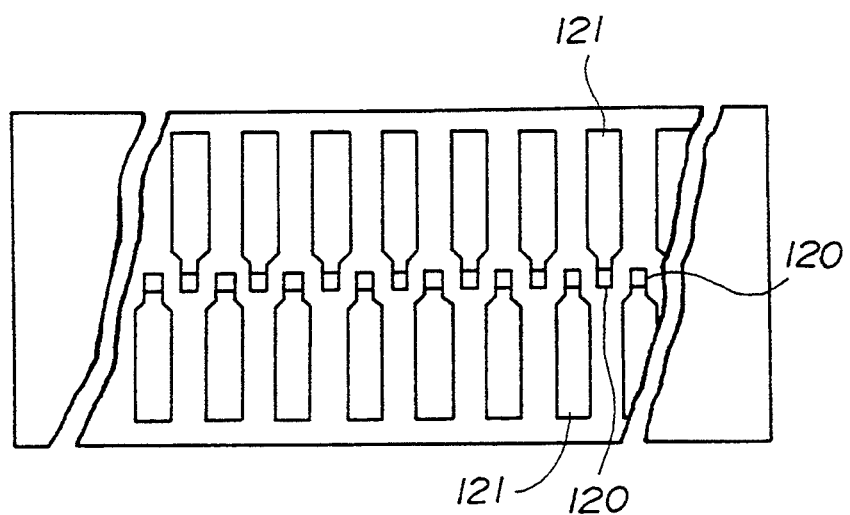
FIG. 3 is a plane view of a conventional plane surface lighting type light emitting diode array.
Figure 4:
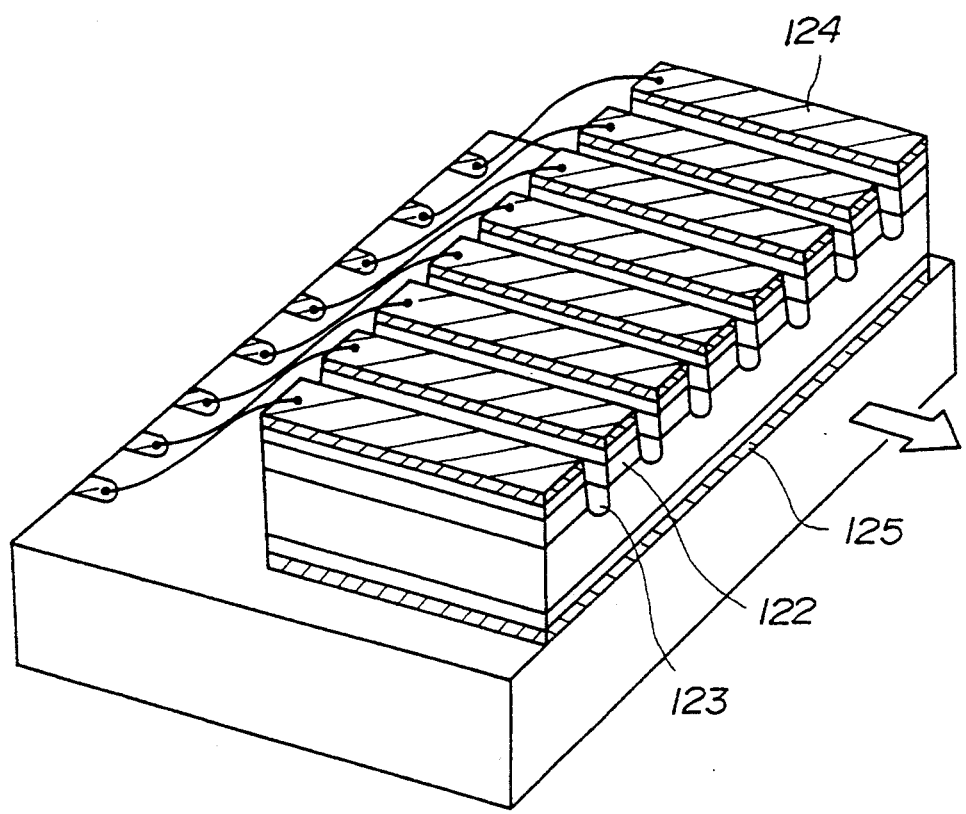
FIG. 4 is an elevational view of a conventional edge surface lighting type light emitting diode array.
Figure 5:
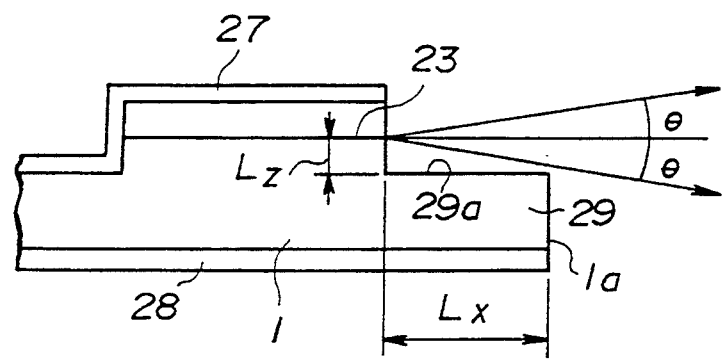
FIG. 5 is a schematic cross sectional view of an array for explaining a principle of the present invention.
Figure 6A:
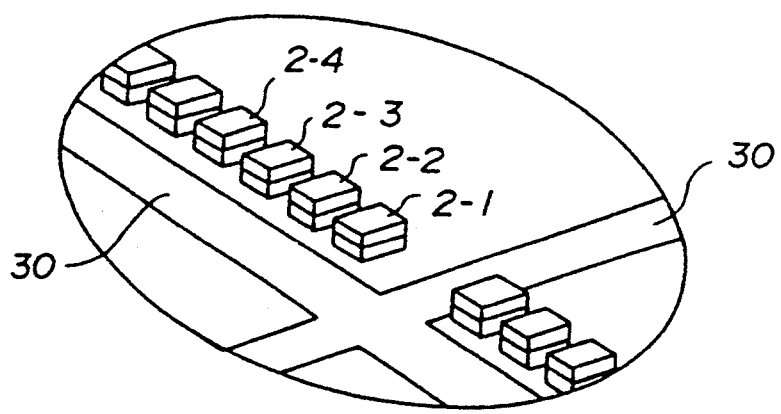
FIG. 6 is an elevational view of a group of light emitting diode arrays formed on a single crystal wafer.
Figure 6B:
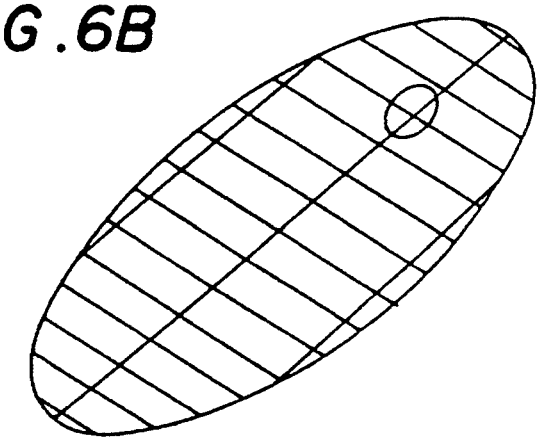
Figure 7A:
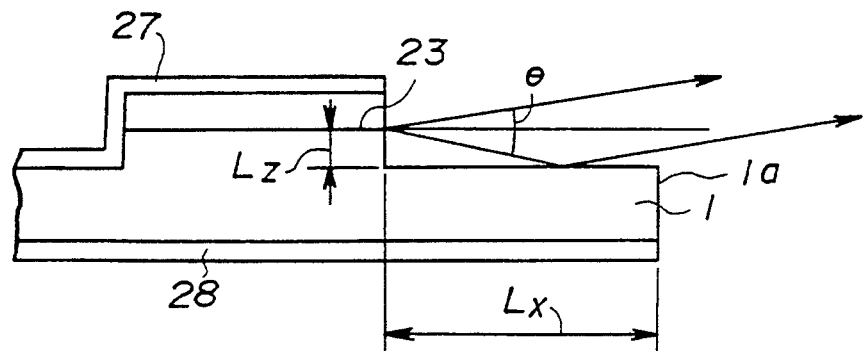
FIG. 7A showing the paths of light beams when a length of a terrace Lx is too long.
Figure 7B:
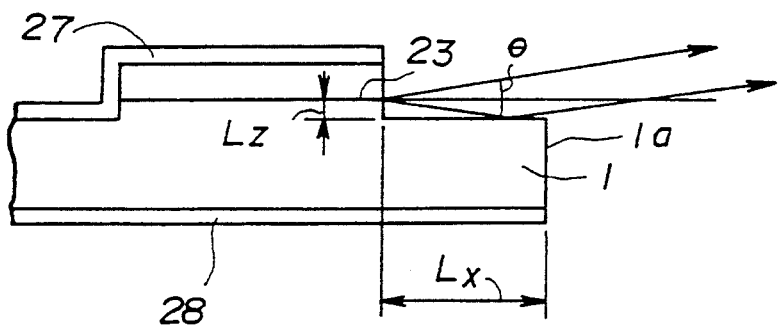
FIG. 7B showing the paths of light beams when a height of a diode element Lz is too short.
Figure 7C:
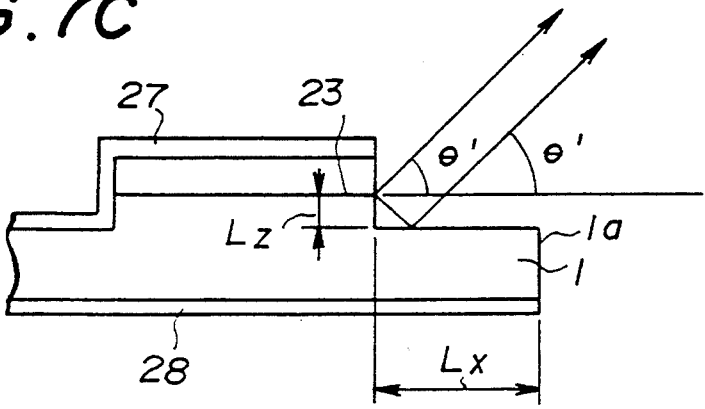
FIG. 7C showing the paths of light beams when an angle $\theta$ is too large.

In FIG. 13A, the far field pattern I has a wide side-robe with a plurality of waves in the angle range from 0° to 60°. This side-robe is considered to be the result of interference between the light directly emitted at an elevational angle and the light reflected from the surface of the substrate, as shown in FIGS. 7A,7B.

On the other hand, in FIG. 13B, the far field pattern II has a narrow side-robe without waves in the angle range from 0° to 60°. This indicates that higher quality of light emitted from the light emitting diode of the present invention can be obtained than with the light emitting diode that does not have steps, as is the case with the comparison sample.

The present invention is not limited to the specifically disclosed embodiments, and variations and modifications may be made without departing from the scope of the present invention.

What is claimed is:

1. A manufacturing method of a light emitting device which comprises:
   forming a plurality of light emitting diodes comprising a layered structure formed on a substrate, and having at least a light emitting layer and electrodes on both sides of the light emitting layer;
   separating said light emitting diode into a plurality of light emitting diode elements by forming a plurality of separation grooves, and forming a first surface to be parallel to a center axis of a light beam emitted from said light emitting diode elements and forming a light emitting edge surface to be perpendicular to the surface of said substrate by an etching method;
   applying a masking onto a predetermined portion of said first surface;
   forming a second surface having a step and so as to be parallel to said first surface, by using an etching method, a first terrace edge is simultaneously formed between the first and second surfaces; and
   separating each light emitting diode element of said plurality of light emitting diodes, so that a second terrace edge is formed on the edge of said substrate;
   said first and second surfaces are formed so as to satisfy the following two equations;

$$Lx_1 < Lz_1/\tan \theta$$

$$Lx_2 < Lz_2/\tan \theta$$

where:
   $Lx_1$ is a distance between said light emitting edge surface and said first terrace edge;
   $Lx_2$ is a distance between said light emitting edge surface and said second terrace edge;
   $Lz_1$ is a distance between said light emitting layer and said first surface;
   $Lz_2$ is a distance between said light emitting layer and said second surface;
   $\theta$ is a diverging angle of the light beam emitted from said light emitting diode elements, from the center axis towards the surface of said substrate.

2. The manufacturing method as claimed in claim 1, wherein said method further comprises:
   forming other light emitting diodes simultaneously with said light emitting diodes on the other end of the surface of said substrate on which surface said light emitting diode elements are formed; and
   forming a monitoring device by separating said other light emitting diode into two portions by an etching method simultaneously with the forming of said separation grooves;
   one of said other separated diodes serving as a light emitting element and the other of said other diodes serving as a photodiode, so as to output a monitor signal concerning light emitted from said light emitting diode elements.

* * * * *